United States Patent [19]
Arikawa et al.

[11] Patent Number: 5,130,778
[45] Date of Patent: Jul. 14, 1992

[54] SEMICONDUCTOR ARTICLE AND PREPARATION THEREOF

[75] Inventors: Shiro Arikawa; Takao Yonehara, both of Atsugi, Japan

[73] Assignee: Canon Kabushiki Kaisha, Tokyo, Japan

[21] Appl. No.: 538,423

[22] Filed: Jun. 15, 1990

Related U.S. Application Data

[60] Division of Ser. No. 528,916, May 29, 1990, Pat. No. 4,999,313, which is a continuation of Ser. No. 427,906, Oct. 24, 1989, abandoned, which is a continuation of Ser. No. 114,870, Oct. 30, 1987, abandoned.

[30] Foreign Application Priority Data

Nov. 7, 1986 [JP] Japan .................. 61-264027

[51] Int. Cl.$^5$ .................. H01L 29/34; H01L 29/06; H01L 29/78
[52] U.S. Cl. .................. 357/54; 357/55; 357/23.7
[58] Field of Search .................. 357/23.7, 54, 55, 41, 357/42, 43

[56] References Cited

U.S. PATENT DOCUMENTS

| | | | |
|---|---|---|---|
| 3,500,137 | 3/1970 | Schroen et al. | 357/23.7 |
| 4,241,359 | 12/1980 | Izumi et al. | 357/49 |
| 4,751,561 | 6/1988 | Tastrzebski | 357/44 |
| 4,775,641 | 10/1988 | Duffy et al. | 357/23.7 |
| 5,061,981 | 10/1991 | Hall | 357/42 |

Primary Examiner—Andrew J. James
Assistant Examiner—Stephen D. Meier
Attorney, Agent, or Firm—Fitzpatrick, Cella, Harper & Scinto

[57] ABSTRACT

There is provided a semiconductor article together with a process for producing the same which article has a plurality of semiconductor single crystal regions comprising a semiconductor single crystal region of one electroconductive type and a semiconductor single crystal region of the opposite electroconductive type on the same insulator substrate. At least the semiconductor single crystal region of one electroconductive type being provided by forming a different material which is sufficiently greater in nucleation density than the material of the insulator substrate and sufficiently fine to the extent that only one single nucleus of the semiconductor material can grow and then permitting the semiconductor material to grow around the single nucleus formed as the center.

3 Claims, 13 Drawing Sheets

SEMICONDUCTOR ARTICLE AND PREPARATION THEREOF

This application is a division of application Ser. No. 07/528,916, filed May 29, 1990, now U.S. Pat. No. 4,999,313, which is a continuation of application Ser. No. 07/427,906, filed on Oct. 24, 1989, now abandoned, which is a continuation of application Ser. No. 07/114,870, filed on Oct. 30, 1987, now abandoned.

BACKGROUND OF THE INVENTION

1. Field of the Invention

This invention relates to a semiconductor article and a method for producing the same, particularly to a semiconductor article having a plurality of semiconductor single crystal regions comprising a semiconductor single crystal region of one electroconductive type and a semiconductor single crystal region of the opposite electroconductive type.

2. Related Background Art

In the prior art, in most cases when semiconductor elements are to be formed on the same substrate, electrical separation has been effected by providing a PN junction portion, an insulating layer, etc. to a semiconductor single crystal substrate of one electroconductive type.

In the following, description is made about one example of such isolation techniques of semiconductor elements formed on a semiconductor single crystal substrate.

Figure 14:
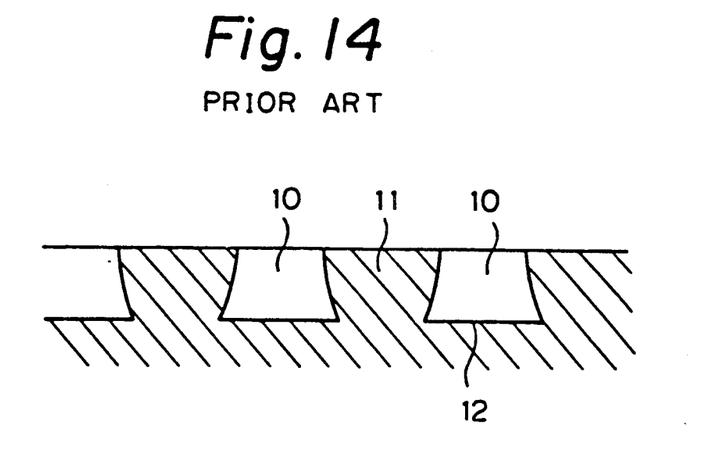
FIG. 14 is a schematic illustration of the PN junction isolation structure.
Figure 15:
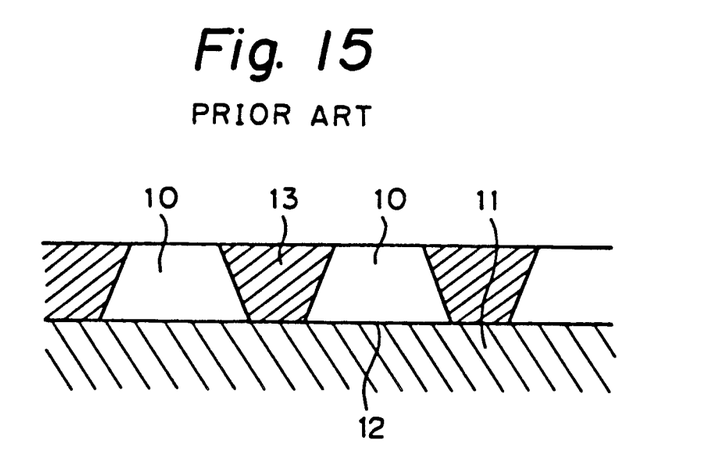
FIG. 15 is a schematic illustration of the insulator isolation structure.

FIG. 14 is a schematic illustration of PN junction isolation structure and FIG. 15 a schematic illustration of insulator isolation structure.

As shown in FIG. 14, the PN junction isolation structure separates each element region 10 from the semiconductor single crystal substrate 11 through a PN junction portion 12. Also, as shown in FIG. 15, the insulator isolation structure separates the side face portion of each element region 10 from an adjacent region 10 through an insulating region 13, while it separates each bottom portion from the semiconductor single crystal substrate 11 through a PN junction portion 12.

The above isolation structure does not affect complete electrical insulation, whereby there is the influence from junction capacitance or parasitic effect. Further, the above isolation structure is used primarily in the case when the respective element regions are of the same electroconductive type. When different electroconductive type element regions are formed on a semiconductor single crystal substrate, that is, when one electroconductive type semiconductor single crystal region and the opposite electroconductive type semiconductor single crystal region are formed on the same substrate to form semiconductor elements in the respective regions (for example, CMOS transistor), the respective regions are opposed through PN junction portions, whereby there is the problem that parasitic effect, etc. appears marketedly.

SUMMARY OF THE INVENTION

An object of the present invention is to provide a semiconductor article which will not generate junction capacitance, parasitic effect, or the like when a semiconductor single crystal region of one electroconductive type and a semiconductor single crystal region of the opposite electroconductive type are formed on the same substrate. A further object of the present invention is to provide a preparation method suitably used in preparing such a semiconductor article.

The semiconductor article of the present invention has a plurality of semiconductor single crystal regions comprising a semiconductor single crystal region of one electroconductive type and a semiconductor single crystal region of the opposite electroconductive type on the same insulator substrate, at least the semiconductor single crystal region of one electroconductive type being provided by forming a different material which is sufficiently greater in nucleation density than the material of said insulator substrate and sufficiently fine to the extent that only one single nucleus of the semiconductor material can grow and then permitting the semiconductor material to grow around the single nucleus formed as the center.

Also, the method for preparing a semiconductor article of the present invention comprises forming a plurality of concavities on an insulator substrate and forming in the concavities a semiconductor single crystal region of one electroconductive type and a semiconductor single crystal region of the opposite electroconductive type, at least said semiconductor single crystal region of one electroconductive type being provided by forming a different material which is sufficiently greater in nucleation density than the material of said insulator substrate and sufficiently fine to the extent that only one single nucleus of the semiconductor material can grow and then permitting the semiconductor material to grow around the single nucleus formed as the center.

In the present invention, the semiconductor single crystal region refers to a region having a single crystal, or substantially single crystal, structure provided by forming a different material which is sufficiently greater in nucleation density than the material of the insulator substrate and sufficiently fine to the extent that only one single nucleus of the semiconductor material can grow and then permitting the semiconductor material to grow around the single nucleus formed as the center.

The semiconductor article and the method for preparation thereof according to the present invention enable formation of a semiconductor single crystal region of one electroconductive type and a semiconductor single crystal region of the opposite electroconductive type on the same insulator substrate. Since the respective semiconductor single crystal regions are formed with an intermediary insulating material therebetween, electrical insulation can be effected completely to prevent the influences from junction capacitance, parasitic effect, etc., whereby a high performance semiconductor device can be provided.

Further, by providing a semiconductor single crystal region of one electroconductive type and a semiconductor single crystal region of the opposite electroconductive type in different preparation steps, respectively, by forming a different material which is sufficiently greater in nucleation density than the material of the insulator substrate and sufficiently fine to the extent that only one single nucleus of the semiconductor material can grow then and permitting the semiconductor material to grow around the single nucleus formed as the center or, alternatively by providing a plurality of one electroconductive semiconductor single crystal regions of one electroconductive type by forming a different material which is sufficiently greater in nucleation density than the material of the insulator substrate and sufficiently fine to the extent that only one single nucleus of the semiconductor material can grow and then permitting the semiconductor material to grow around the single nucleus formed as the center, and providing a semiconductor single crystal region of the opposite electroconductive type on a part of the above semiconductor single crystal regions of one electroconductive type, electroconductive type semiconductor single crystal regions can be formed during formation of semiconductor single crystal regions, whereby the preparation steps of impurity ion implantation and thermal diffusion can be avoided, with the result that damages to the semiconductor single crystal regions by ion implantation and stresses based on the difference in thermal expansion coefficient from the deposition surface during high temperature heat treatment can be remarkably alleviated to reduce junction leak current internally of crystals, and leak current between deposition surfaces and crystal surfaces.

DESCRIPTION OF THE PREFERRED EMBODIMENTS

Referring to the drawings, the embodiments of the present invention are described in detail. In the respective embodiments described below, the same numerals are attached to the same members.

Figure 1:
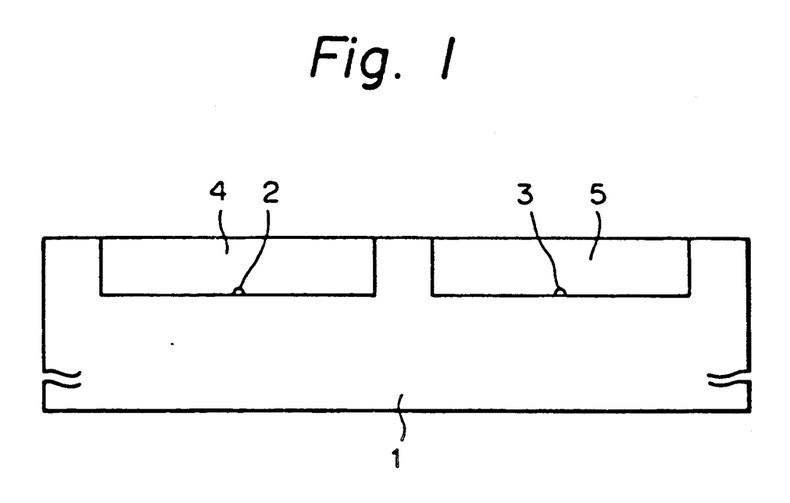
FIG. 1 is a schematic partial cross-sectional view of a first embodiment of the semiconductor article according to the present invention.

FIG. 1 is a schematic partial cross-sectional view showing a first embodiment of the semiconductor article according to the present invention.

In FIG. 1, 1 is an insulator base plate which is an insulator substrate, and here it is formed of $SiO_2$. Nucleation bases 2 and 3 are of different materials provided on the insulator substrate, and here they are formed of $Si_3N_4$. N-type semiconductor single crystal region and P-type semiconductor region 5 are formed according to the preparation methods as described below, respectively.

FIGS. 2(a)-2(d) illustrate diagramatically the steps for preparation of the semiconductor article of the above first embodiment according to the first embodiment of the preparation method of the present invention.

Figure 2A:
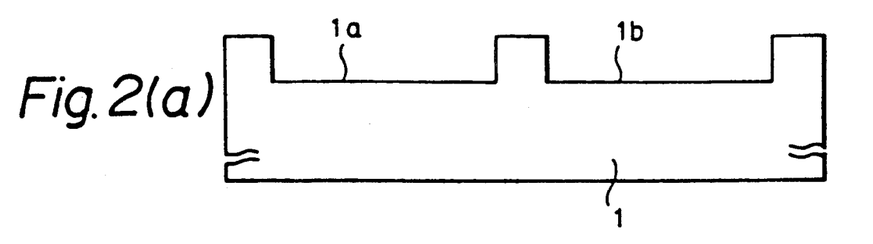
FIGS. 2(a)-2(d), 3(a)-3(d) and 4(a)-4(d) illustrate diagramatically the steps for preparation of the semiconductor article of the above first embodiment according to embodiments of the method for preparation of a semiconductor article of the present invention.

First, as shown in FIG. 2(a), concavities 1a, 1b are formed by the use of photoetching on the insulator substrate 1. Etching is formed to a depth of some microns to approximately ten microns.

Figure 2B:
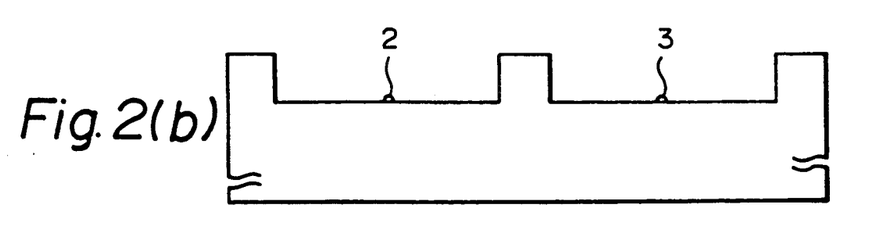
Figure 2C:
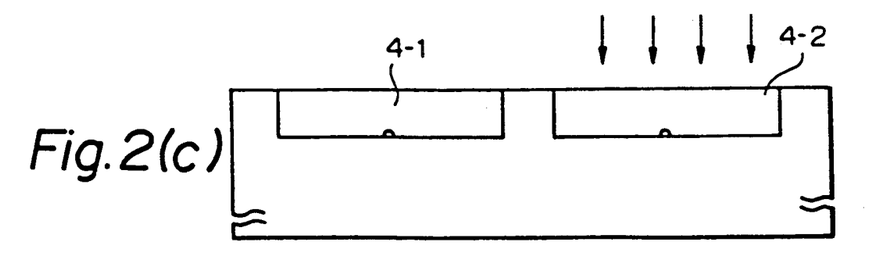

Next, as shown in FIG. 2(b), on the deposition surfaces of the concavities 1a, 1b, nucleation bases 2, 3 are formed. Next, as shown in FIG. 2(c), single crystals or substantially single crystals are permitted to grow around the single nuclei formed on the nucleation bases 2, 3 as the centers, respectively. During this operation, N-type impurity such as phosphorus, arsenic, antimony, etc. is doped to form N-type semiconductor single crystal regions 4-1 and 4-2. Then, P-type impurity such as boron, etc. is injected according to the ion implantation technique into the N-type semiconductor single crystal region 4-2. During this operation, the N-type semiconductor single crystal region 4-1 is protected with a photoresist, $SiO_2$, etc.

Figure 2D:
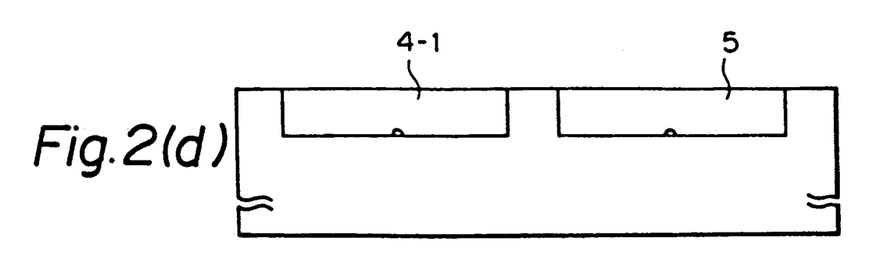

Next, as shown in FIG. 2(d), boron injected is diffused by the thermal diffusion method to form a P-type semiconductor single crystal region 5.

FIG. 3(a)-3(d) illustrate diagramatically steps for preparation of the semiconductor article of the above first embodiment according to the second embodiment of the method for preparation of a semiconductor article of the present invention.

This embodiment is the preparation method which is used primarily when it is desired to make the impurity concentrations in the P-type semiconductor single crystal region and the N-type semiconductor single crystal region substantially equal to each other.

In the preparation steps of this embodiment, up to formation of the P-type semiconductor single crystal region 5, the procedures are the same as in the above embodiment shown in FIGS. 2(a)-2(c) except for suppressing the impurity concentrations in the N-type semiconductor single crystal regions 4-1, 4-2, to about $10^{14}$ atom/cm$^3$.

Figure 3A:
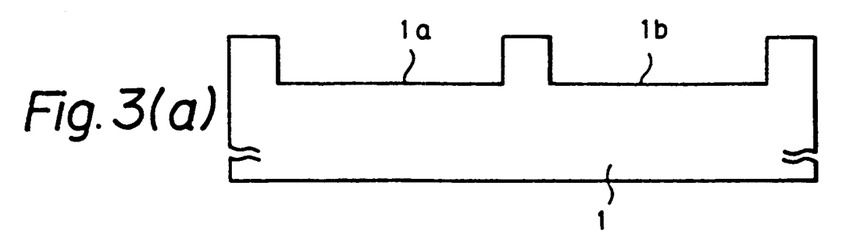
Figure 3B:
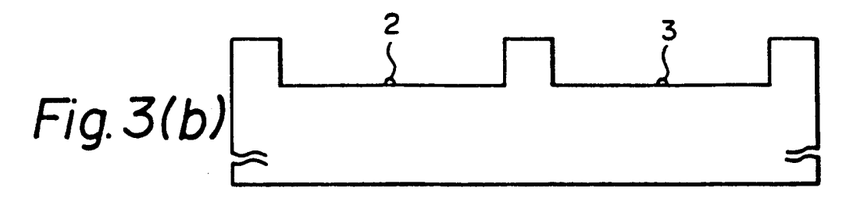
Figure 3C:
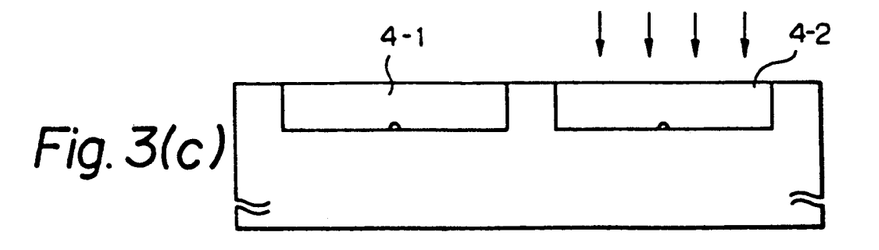
Figure 3D:
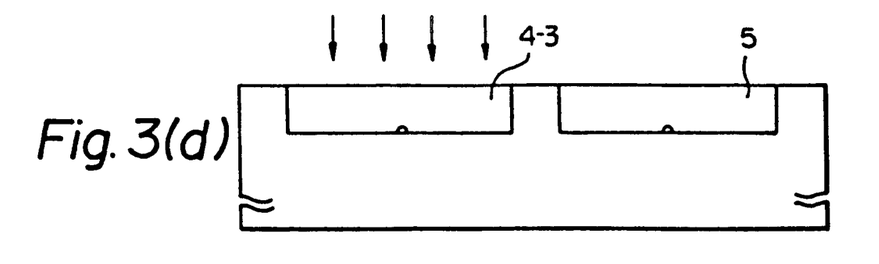

In this embodiment, as shown in FIG. 3(d), after formation of P-type semiconductor single crystal region 5, N-type impurity such as phosphorus, arsenic, antimony, etc. is injected according to the ion implantation technique into the N-type semiconductor single crystal region 4-1 to form an N-type semiconductor single crystal region 4-3.

The two embodiments of the preparation method as described above, which employ the ion implantation technique, involve crystal defects, etc. brought about from damages by ion implantation and stresses by thermal diffusion, etc. These problems can be solved by use of the preparation method as described below.

FIGS. 4(a)-4(d) illustrate diagramatically the steps for preparation of the semiconductor article of the above first embodiment according to the third embodiment of the method for preparation of semiconductor article of the present invention.

Figure 4A:
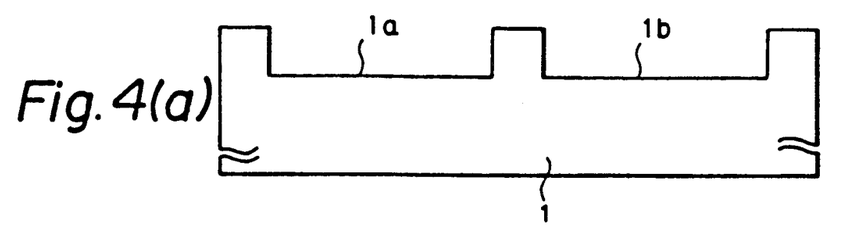

First, as shown in FIG. 4(a), concavities 1a, 1b are formed by use of photoetching on the insulator substrate 1. The depth of etching is formed to some microns to approximately ten microns.

Figure 4B:
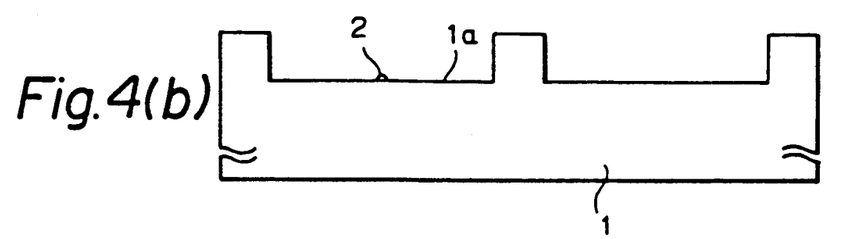

Next, as shown in FIG. 4(b), nucleation base 2 is formed on the deposition surface of a part of the concavity 1a.

Figure 4C:
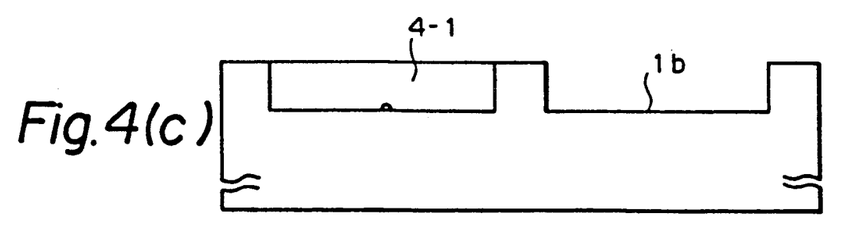

Next, as shown in FIG. 4(c), a single crystal or a substantially single crystal is permitted to grow around the single nucleus formed at the nucleation base 2 as the center. During this operation, N-type impurity such as phosphorus, arsenic, antimony, etc. is doped to form a N-type semiconductor single crystal region 4-1.

Figure 4D:
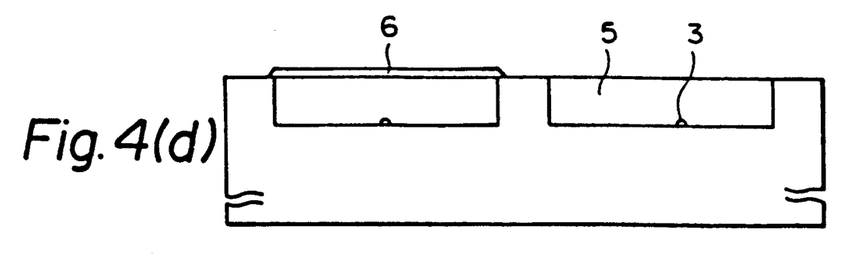

Next, as shown in FIG. 4(d), $SiO_2$ film 6 which is a protective film is formed according to thermal oxidation, the CVD method, etc. on the N-type semiconductor single crystal region 4-1. Then, on the remaining concavity 1b is formed a nucleation base 3, and a single crystal or a substantially single crystal is permitted to grow around the single nucleus formed on the nucleation base 3 as the center. During this operation, P-type impurity such as boron, etc. is doped to form a P-type semiconductor single crystal region 5. Thereafter, the $SiO_2$ film 6 is removed.

The above preparation method of the present invention prepares a semiconductor article without the use of the ion implantation method and the thermal diffusion method, and enables lower noise, reduction in leak current, etc.

In the above embodiment, nucleation bases 2, 3 are separately formed, but the nucleation bases 2, 3 can be also formed at the same time.

Figure 5:
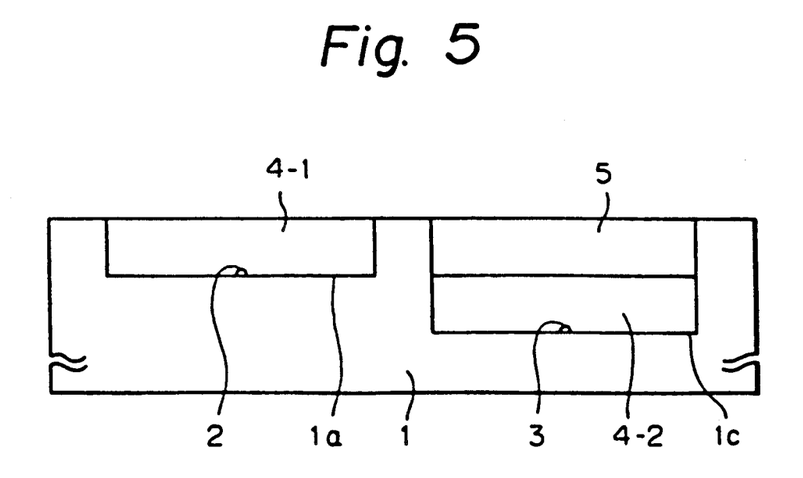
FIG. 5 is a schematic partial sectional view of a second embodiment of the semiconductor article according to the present invention.

FIG. 5 illustrates schematically a partial sectional view of the second embodiment of the semiconductor article according to the present invention.

As shown in FIG. 5, the concavities on the insulator substrate 1 comprise concavities 1a, 1c having different depths. Nucleation bases 2, 3 are formed respectively on the deposition surfaces at the bottoms of the concavities 1a, 1c. Beneath the P-type semiconductor single crystal region 5 is provided the N-type semiconductor single crystal region 4-2 and, as described below, the N-type semiconductor single crystal region 4-2 and the N-type semiconductor single crystal region 4-1 are formed at the same time.

FIGS. 6(a)–6(d) illustrate diagramatically the steps for preparation of the semiconductor article of the above second embodiment according to the fourth embodiment of the method for preparation of a semiconductor article of the present invention.

Figure 6A:
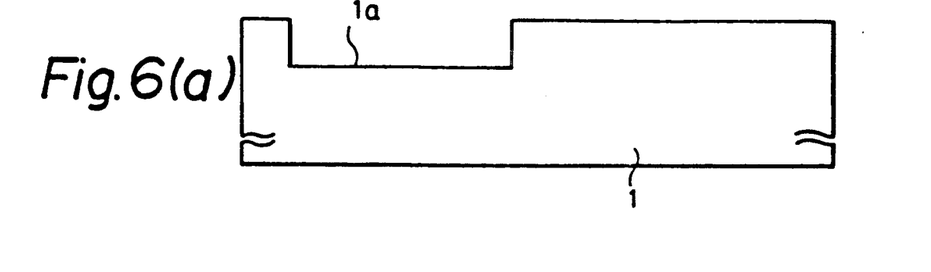
FIGS. 6(a)-6(d) illustrate diagramatically the steps for preparation of the semiconductor article of the above second embodiment according to the method for preparation of a semiconductor article of the present invention.

First, as shown in FIG. 6(a), a concavity 1a is formed by use of photoetching on the insulating substrate 1.

Figure 6B:
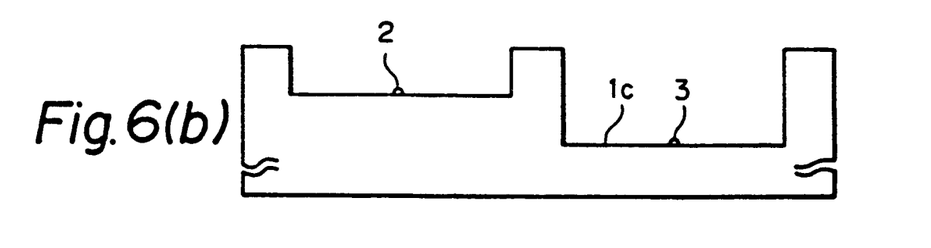
Figure 6C:
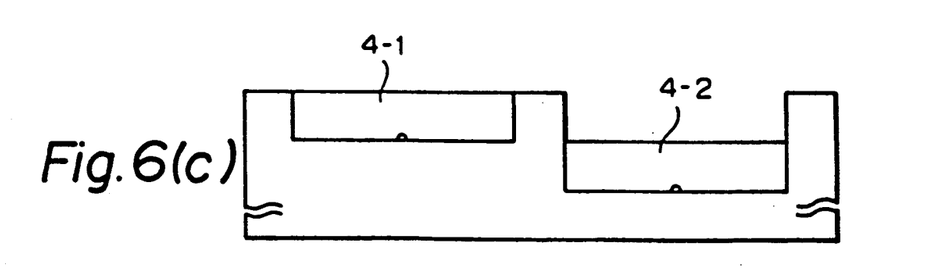

Next, as shown in FIG. 6(b), a concavity 1c having a depth about twice the depth of the concavity 1a is formed by use of photoetching. Then, on the deposition surfaces at the bottoms of the concavities 1a, 1c, nucleation bases 2, 3 are formed. Next, as shown in FIG. 6(c), single crystals or substantially single crystals are permitted to grow around the single nuclei formed on the nucleation bases 2, 3 as the center. During this operation, N-type impurity such as phosphorus, arsenic, antimony, etc. is doped to form N-type semiconductor single crystal regions 4-1 and 4-2.

Figure 6D:
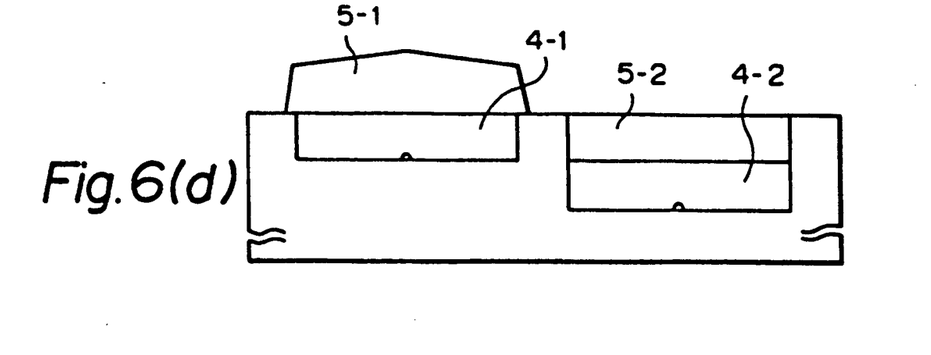

Next, as shown in FIG. 6(d), P-type impurity such as boron, etc. is doped into the N-type semiconductor single crystal regions 4-1, 4-2, to permit P-type semiconductor single crystal regions 5-1, 5-2 to grow until the upper surface of the P-type semiconductor single crystal region exceeds the substrate surface. Then, the surface of the P-type semiconductor single crystal regions 5-1, 5-2 are flattened by etch back to prepare a semiconductor article as shown in FIG. 5.

In the embodiments of the semiconductor articles and the preparation methods therefor as described above, similar effects can be obtained by making the P-type semiconductor single crystal region a N-type semiconductor single crystal region and the N-type semiconductor single crystal region a P-type semiconductor single crystal region.

In the following, the method for forming the semiconductor single crystal region is to be described in detail.

First, description is made about the selective deposition method in which a deposited film is formed selectively on the deposition surface. The selective deposition method is a method for forming a thin film selectively on a substrate by utilizing the difference between materials in factors influencing nucleation in the process of forming thin film such as surface energy, adhesion coefficient, elimination coefficient, surface diffusion speed, etc.

Figure 7:
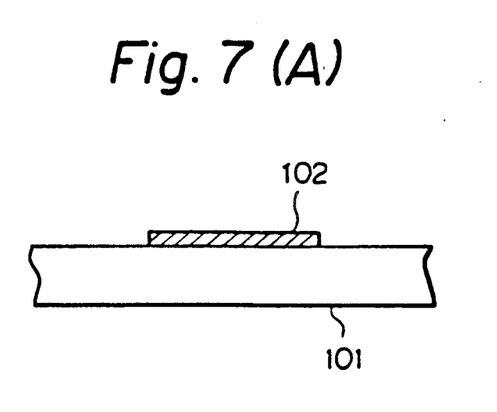
FIGS. 7(A) and 7(B) are illustrations for explanation of the selective deposition method.

FIGS. 7(A) and 7(B) illustrate diagramatically the selective deposition method. First, as shown in FIG. 7(A), on the substrate 101, a thin film 102 comprising a material different in the above factors from the substrate 101 is formed at a desired portion. And, when a thin film comprising an appropriate material is deposited according to suitable deposition conditions, it becomes possible to give rise to a phenomenon that the thin film 103 grows only on the thin film 102 without growth on the substrate. By utilizing this phenomenon, a thin film 103 formed self-adjustedly can be grown, whereby the lithographic steps by use of a resist as in the prior art can be omitted.

As the material which can afford deposition according to such selective formation method, there may be employed, for example, $SiO_2$ as the substrate, 101, Si, GaAs, silicon nitride as the thin film 102, and Si, W, GaAs, InP, etc. as the thin film 103 to be deposited.

Figure 8:
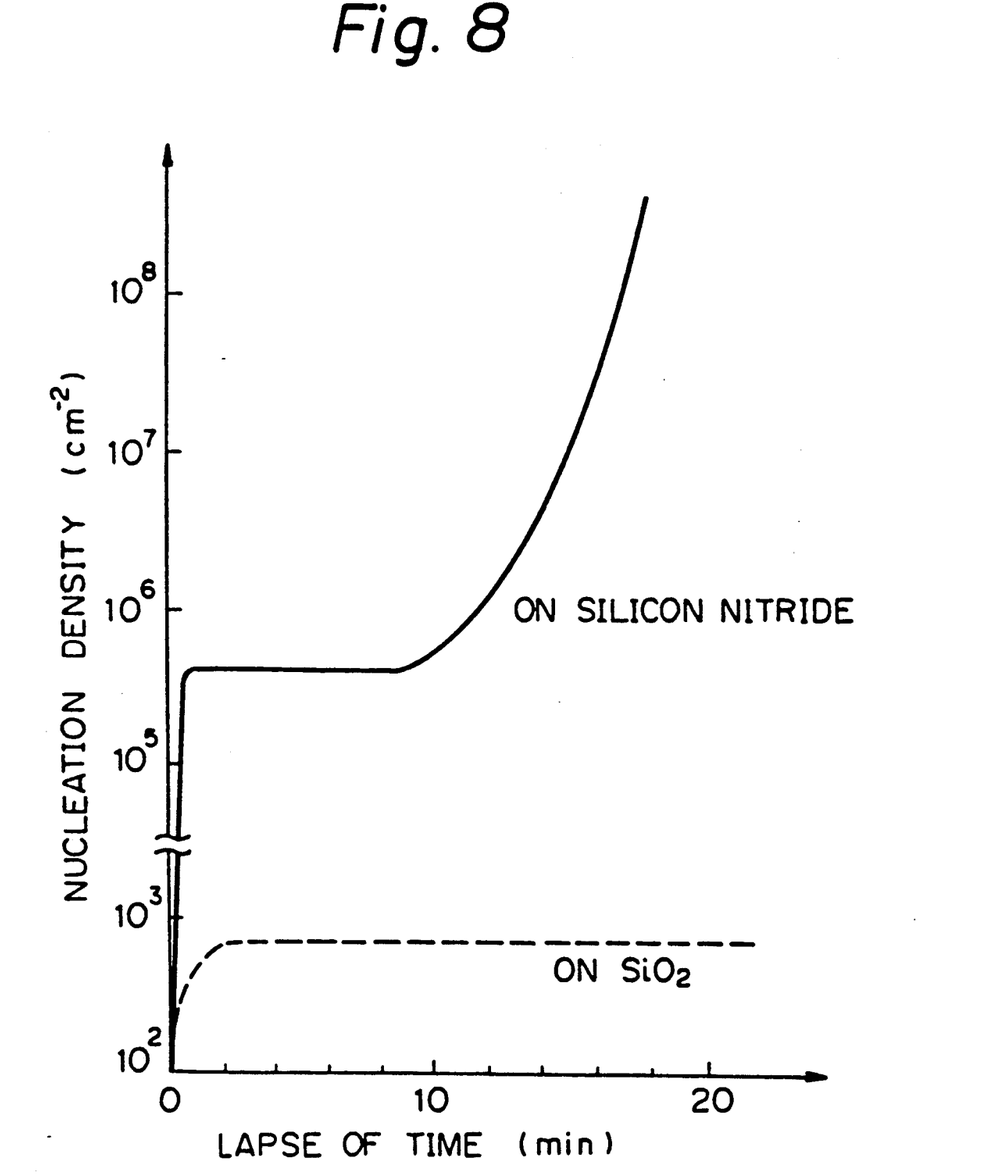
FIG. 8 is a graph showing the changes with lapse of time in nucleation density on the deposition surface of $SiO_2$ and the deposition surface of silicon nitride.

FIG. 8 is a graph showing the change with lapse of time in nucleation density on the deposition surface of $SiO_2$ and the deposition surface of silicon nitride.

As shown in FIG. 8, the nucleation density on the $SiO_2$ is saturated soon after initiation of the deposition to $10^3$ cm$^{-2}$ or lower, which value is substantially unchanged even after 20 minutes.

In contrast, on silicon nitride ($Si_3N_4$), it is once saturated at ca. $4 \times 10^5$ cm$^{-2}$, which is not changed for 10 minutes thereafter, but sequentially abruptly increased. In this measurement example, there is shown the case in which $SiCl_4$ gas is diluted with $H_2$ gas and deposited according to the CVD method under the conditions of a pressure of 175 Torr and a temperature of 1000° C. Otherwise, the same action can be obtained by use of $SiH_4$, $SiH_2Cl_2$, $SiHCl_3$, $SiF_4$, etc. as the reactive gas and controlling the pressure, the temperature, etc. Also, vacuum vapor deposition can be employed.

In this case, nucleation on $SiO_2$ poses substantially no problem, but nucleation on $SiO_2$ can be further inhibited by addition of HCl gas in the reactive gas, whereby deposition of Si can be made zero on $SiO_2$.

Such phenomenon owes greatly to the difference in absorption coefficient, elimination coefficient, surface diffusion coefficient, etc. relative to $SiO_2$ and Si on the material surface of silicon nitride, but SiO$_2$ reacts with Si atom itself to form silicon monooxide with higher vapor pressure to etch SiO$_2$ itself, while no such etching phenomenon occurs on silicon nitride. This may be also considered to be a cause to effect selective deposition (T. Yonehara, S. Yoshioka, S. Miyazawa, Journal of Applied Physics 53, 6839, 1982).

By selecting thus SiO$_2$ and silicon nitride as the materials for the deposition surface and selecting silicon as the material to be deposited, a sufficiently great nucleation density difference can be obtained as shown in the same graph. Here, although SiO$_2$ is desirable as the material for the deposition surface, it is not limitative of the invention, but nucleation density difference can be obtained also by use of SiOx.

Of course, these materials are not limitative of the invention, but the difference in nucleation density may be $10^3$-fold in terms of density of the nucleus as shown in the same graph, and selective formation of the deposited film can be also done with the use of the material as exemplified below.

As another method for obtaining the nucleation density difference, a region containing excessively Si, N, etc. may be formed by injecting locally ions of Si, N, etc. on the SiO$_2$.

By utilizing such selective deposition method and forming a different material sufficiently greater in nucleation density than the material for the deposition surface sufficiently finely so that only single nucleus may grow, a single crystal or substantially single crystal can be grown selectively only at the site where such fine different material exists.

Since selective growth of a single crystal or substantially single crystal is determined by the electron state, particularly the state of dangling bonds on the deposition surface, the material with lower nucleation material (e.g. SiO$_2$) is not required to be a bulk material, but it may be formed only on the surface of any desired material or substrate to form the deposition surface as described above.

Figure 9A:
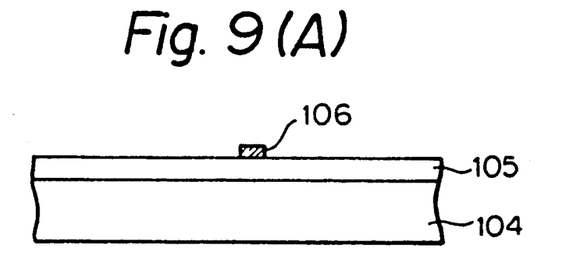
FIGS. 9(A)-9(D) illustrate diagramatically the formation steps showing one example of the formation method of single crystal or substantially single crystal.
Figure 9B:
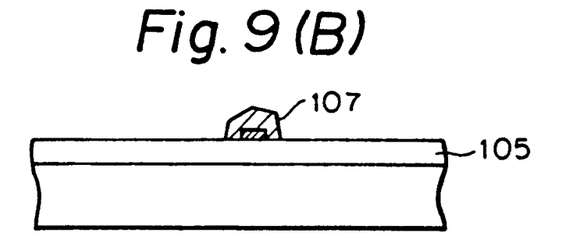
Figure 9C:
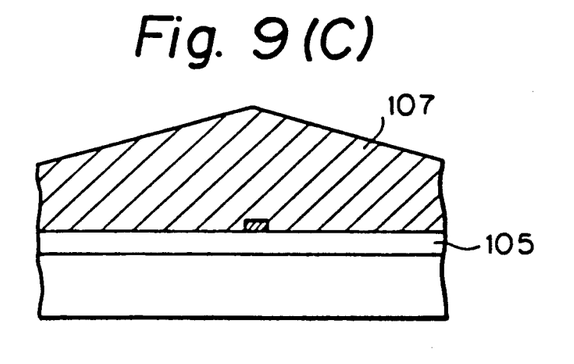
Figure 9D:
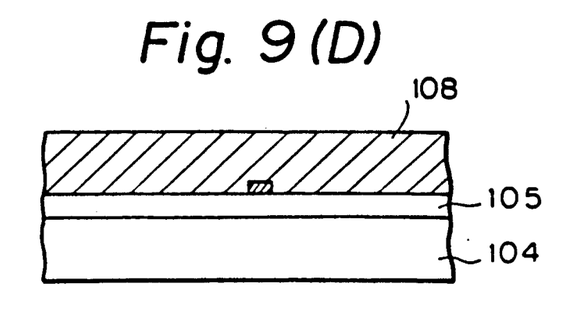
Figure 10:
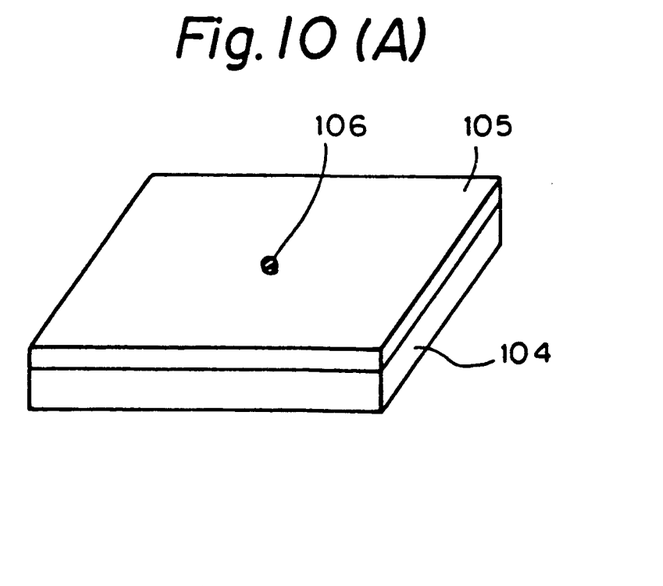
FIGS. 10(A) and 10(B) are perspective views of the substrate in FIGS. 9(A) and 9(D).

FIGS. 9(A)–9(D) illustrate diagramatically the steps of an embodiment of the method for forming a single crystal or substantially single crystal, and FIGS. 10(A) and 10(B) are perspective views of the substrate in FIGS. 9(A) and 9(D), respectively.

First, as shown in FIG. 9(A) and FIG. 10(A), a thin film 105 with small nucleation density enabling selective deposition is formed on the substrate 104, and a different material with greater nucleation density is thinly deposited thereon, followed by patterning according to lithography, etc. to form sufficiently finely the different material 106. However, the size, the crystal structure and the composition of the substrate 104 may be any desired ones, and it may be a substrate having functional elements formed thereon. Also, the different material 106 is also inclusive of the denatured region having excessively Si, N, etc. formed by ion injection of Si, N, etc. into the thin film 105 as described above.

Next, a single nucleus of the thin film material is formed only on the different material 106 according to appropriate deposition conditions. That is, the different material 106 is required to be formed sufficiently fine to the extent such that only single nucleus may be formed. The size of the different material, which differs depending on the material employed, may be some microns or less. Further, the nucleus grows while maintaining a single crystalline structure or substantially single crystalline structure, but will become single crystal grain in shape of island as shown in FIG. 9(B). For formation of single crystal grains 107 shaped in island, it is necessary to determine the conditions so that no nucleation may occur on the thin film 105 at all, as already described.

The single crystal grain 107 shaped in island further grows around the different material 106 as the center while maintaining substantially single crystal structures to cover wholly over the thin film 105 as shown in FIG. 9(C).

Subsequently, the single crystal grain 107 is flattened by etching or polishing to form a single crystal layer 108 capable of forming a desired element on the thin film 105, as shown in FIG. 9(D) and FIG. 10(B).

Since a thin film 105 which is the material for the deposition surface is thus formed on the substrate 104, any desired material can be employed for the substrate 104 which becomes the support, and further even when the substrate may have functional elements, etc. formed thereon, a single crystal layer can be easily formed thereon.

In the above embodiments, the material for the deposition surface is formed of a thin film 105, but a substrate comprising a material with small nucleation density enabling selective deposition may be also used as such and a single layer may be formed similarly thereon.

EXAMPLE

In the following, a specific method for forming the single crystal layer in the above embodiment is to be described.

SiO$_2$ is made the material for the deposition surface of the thin film 105. Of course, a quartz substrate may be employed, or a SiO$_2$ layer may be formed on the substrate surface by use of the sputtering method, the CVD method, the vacuum vapor deposition method, etc. on any desired surface such as metals, semiconductors, magnetic materials, piezoelectric members, insulators, etc. Also, although SiO$_2$ is desirable for the deposition surface material, SiOx with the value of x being varied may be available.

On the thus formed SiO$_2$ layer 105, a silicon nitride layer (here, Si$_3$N$_4$ layer) or a polycrystalline silicon layer is deposited as the different material according to the reduced pressure gas phase growth method, and the silicon nitride layer or the polycrystalline silicon layer is subjected to patterning according to conventional lithographic technique or the lithographic technique by use of X-rays, electron beam or an ion beam to form a fine different material 106 a few microns or less in thickness, desirably ca. 1 μm or less.

Subsequently, by use of a gas mixture of HCl and H$_2$, SiH$_2$Cl$_2$, SiCl$_4$, SiHCl$_3$, SiF$_4$ or SiH$_4$, Si is permitted to grow selectively on the above substrate. The substrate temperature during this operation is 700° to 1100° C. and the pressure is about 100 Torr.

Within a time of about several 10 minutes, the grain of single crystal Si 107 grows around the fine different material 106 of silicon nitride or polycrystalline silicon on SiO$_2$ as the center, and it grows to a size of some 10 μm or more under optimally controlled growth conditions.

Subsequently, by reactive ion etching (RIE) having etching speed difference between Si and SiO$_2$, only Si is etched to be flattened, whereby a polycrystalline silicon layer controlled in grain size is formed, and further the grain boundary portion is removed to form a single crystal silicon layer 108 in shape of an island is formed. When unevenness on the surface of the single crystal grain 107 is great, mechanical polishing is effected before etching.

When an electrical field effect transistor is formed on the single crystal silicon layer 108 containing no grain boundary with some 10 μm or more thus formed, characteristics not inferior to that formed on a single crystal silicon wafer were exhibited.

Also, since electrically separated through $SiO_2$ from the adjacent single crystal silicon layer 108, there is no mutual interference even when a complementary type electrical field effect transistor (C-MOS) may be constituted. Also, since the thickness of the active layer of the element is thinner than in the case of using Si wafer, erroneous actuation due to charges within the wafer generated when irradiated with radiation is eliminated. Further, since parasitic capacitance is lowered, high speed performance of the element can be effected. Also, since any desired substrate can be used, a single crystal layer can be formed at lower cost on a large area substrate than by use of Si wafer. Further, since the single crystal layer can be formed also on a substrate such as another semiconductor, piezoelectric member, dielectric member, etc., a multi-functional three-dimensional integrated circuit can be realized.

Composition of Silicon Nitride

For obtaining sufficient nucleation density the difference between the deposition surface material and the different material as described above, the material is not limited to $Si_3N_4$, but it may be also one with a varied composition of silicon nitride.

In the plasma CVD method which forms a silicon nitride film at a low temperature by decompositing $SiH_4$ gas and $NH_3$ gas in RF plasma, the composition ratio of Si and N in the silicon nitride film deposited can be varied to great extent by varying the flow rate ratio of $SiH_4$ gas and $NH_3$ gas.

Figure 11:
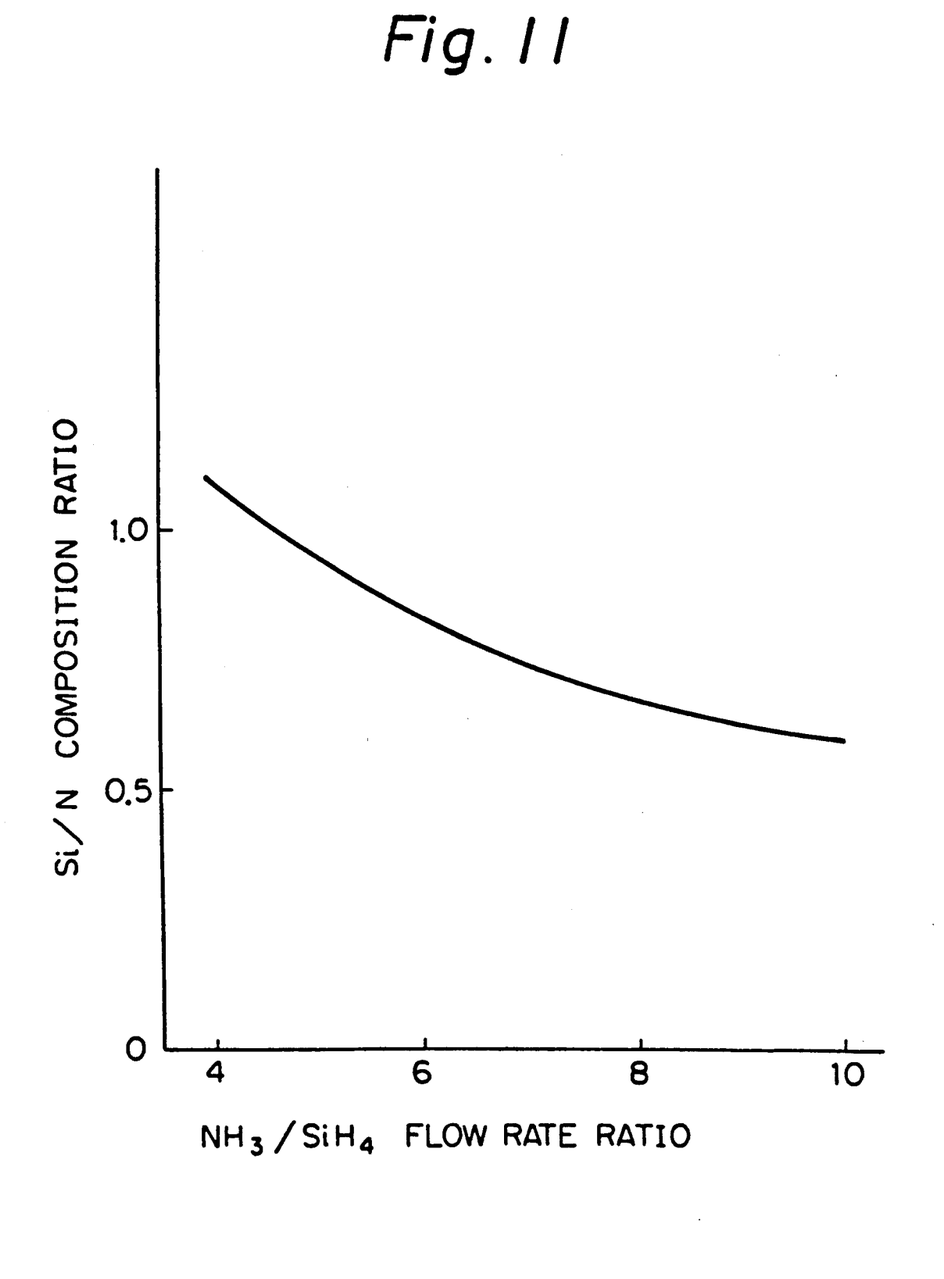
FIG. 11 is a graph showing the relationship between the flow rate ratio of $SiH_4$ and $NH_3$ and the composition ratio of Si and N in the silicon nitride film formed.

FIG. 11 is a graph showing the relationship between the flow rate ratio of $SiH_4$ and $NH_3$ and the composition ratio of Si and N in the silicon nitride film formed.

The deposition conditions at this time are 175 W of RF output, 380° C. of substrate temperature, and the $SiH_4$ gas flow rate is fixed at 300 cc/min., with the flow rate of $NH_3$ gas being varied. As shown in the same graph, by varying the gas flow rate ratio of $NH_3/SiH_4$ from 4 to 10, the Si/N ratio in silicon nitride film is varied from 1.1 to 0.58, as clarified by Auger electron spectroscopy.

Also, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C. was found to be approximate to $Si_3N_4$ (Si/N=0.7) which is substantially the stoichiometric ratio.

On the other hand, the silicon nitride film formed by heat treatment of Si in ammonia or $N_2$ at about 1200° C. can be obtained with a composition further approximate to the stoichiometric ratio, because the formation method is conducted under thermal equilibrium.

When nucleus of Si is grown by use of the silicon nitride formed according to the various methods as described above as the deposition surface material with higher nucleation density of Si than $SiO_2$, there is created a difference in nucleation density depending on its composition ratio.

Figure 12:
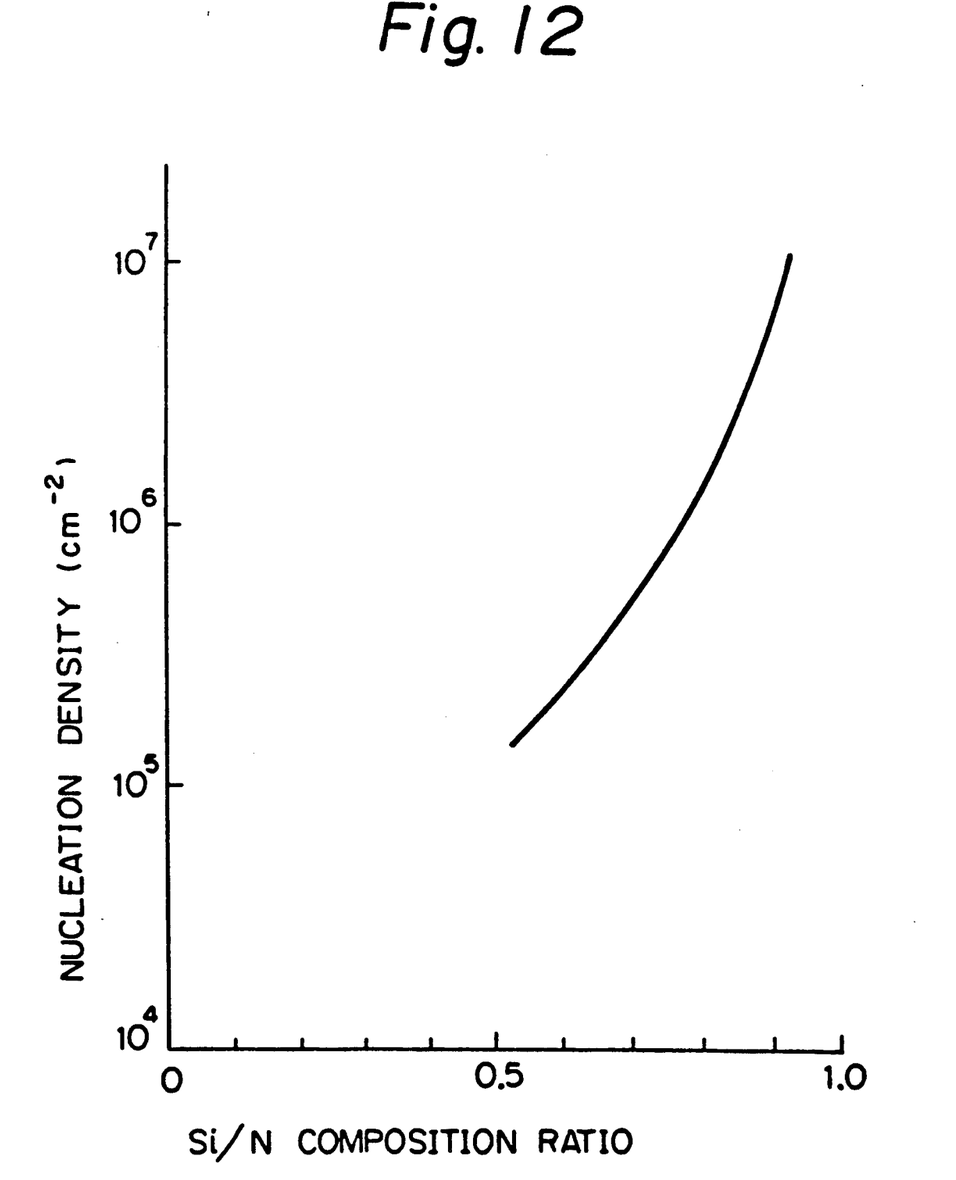
FIG. 12 is a graph showing the relationship between Si/N composition ratio and nucleation density.

FIG. 12 is a graph showing the relationship between Si/N composition ratio and nucleation density. As shown in the same graph, by varying the composition of the silicon nitride film, the nucleation density of Si grown thereon is varied to great extent. The nucleation conditions at this time are such that Si is formed by the reaction of $SiCl_4$ gas with $H_2$ gas in a reduced pressure of 175 Torr at 1000° C.

The phenomenon that nucleation density thus varies depending on the composition of silicon nitride will affect the size of the silicon nitride as the different material which is formed sufficiently fine to the extent for growth of a single nucleus. That is, the silicon nitride having a composition with great nucleation density cannot form a single nucleus, unless it is formed very finely.

Accordingly, it is necessary to select a nucleation density and the optimum size of the silicon nitride which can select a single nucleus. For example, under the deposition conditions for obtaining a nucleation density of ca. $10^5$ cm$^{-2}$, a single nucleus can be selected if the size of silicon nitride is about 4 μm or less.

Formation of A Different Material by Ion Implementation

As a method for realizing nucleation density difference for Si, it is also possible to effect ion injection of Si, N, P, B, F, Ar, He, C, As, Ga, Ge, etc. locally on the surface of $SiO_2$ which is a deposition surface material with low nucleation density to form a modified region on the deposition surface of $SiO_2$ and use the modified region as the deposition surface material with high nucleation density.

For example, the $SiO_2$ surface may be covered with a resist and the desired site is exposed, developed and dissolved to have the $SiO_2$ partially exposed.

Subsequently, by use of $SiF_4$ as the source gas Si ions are injected onto the $SiO_2$ surface at 10 keV at a density of $1 \times 10^{16}$ to $10^{18}$ cm$^{-2}$. The projected flight length with this implantation is 114 Å, and Si concentration on the $SiO_2$ surface reaches ca. $10^{22}$ cm$^{-3}$. Since $SiO_2$ is inherently amorphous, the region injected with Si ions is also amorphous.

For formation of the modified region, ion injection can be also effected with the use of a resist as the mask, but Si ions may be also injected onto the $SiO_2$ surface by use of the converged ion beam technique without use of a resist mask.

After ion injection is thus effected, by peeling off the resist, a modified region with excessive Si is formed on the $SiO_2$ surface. On the $SiO_2$ deposition surface having such modified region formed thereon, Si is grown by the gas phase growth.

Figure 13:
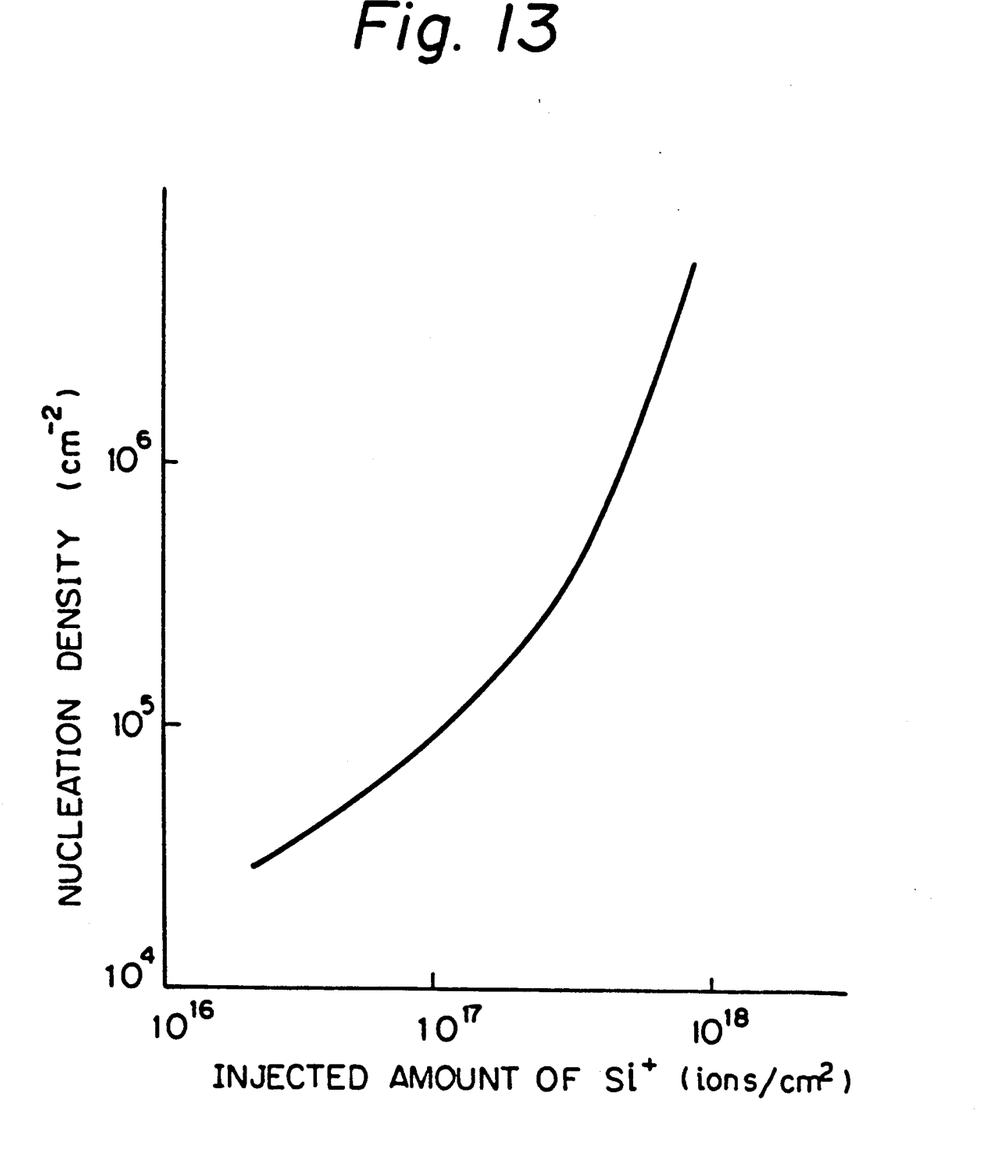
FIG. 13 is a graph showing the relationship between injected amount of Si ions and nucleation density.

FIG. 13 is a graph showing the relationship between injected amount of Si ions and nucleation density.

As shown in the same graph, it can be understood that nucleation density is increased as the amount of Si+ injected is greater.

Accordingly, by forming the modified region sufficiently finely, a single nucleus of Si can be grown with the modified region as the different material, whereby a single crystal can be grown as described above.

Formation of a modified region with sufficiently fine size to enable growth of a single nucleus can be accomplished easily by patterning of a resist or narrowing of the beam of the converged ion beam.

Si Deposition Method Other Than CVD

For growth of a single crystal by selective nucleation of Si, not only CVD method but also the method in which Si is evaporated with the use of electron gun in vacuum ($<10^{-6}$ Torr) to be deposited on a heated substrate can be also used. Particularly, in the MBE (Molecular Beam Epitaxy) method in which vapor deposition is effected in ultra-high vacuum ($<10^{-9}$ Torr), it has been known that Si beam begins to react with $SiO_2$ at a substrate temperature of 900° C. or higher, whereby nucleation of Si on $SiO_2$ becomes zero (T. Yonehara, S. Yoshioka and S. Miyazawa, Journal of Applied Physics 53, 10, p. 6839, 1983).

By utilizing this phenomenon, single nuclei of Si were formed with complete selectivity on the fine silicon nitride spotted on $SiO_2$ and single crystalline Si could be grown thereat. The deposition conditions at this time were $10^{-8}$ Torr or less of vacuum degree, $9.7 \times 10^{14}$ atoms/cm$^2$. sec of Si beam intensity and 900° C. to 1000° C. of substrate temperature.

In this case, SiO which is a reaction product with remarkably high vapor pressure is formed through the reaction of $SiO_2 + Si \rightarrow 2$ SiO ↑, and etching with Si of $SiO_2$ itself occurs through this evaporation.

In contrast, no such etching phenomenon as mentioned above occurs on silicon nitride, but nucleation and deposition occur.

Therefore, similar effects can be also obtained by use of tantalum oxide ($Ta_2O_5$), silicon nitride oxide (SiON), etc. other than silicon nitride as the deposition surface material with high nucleation density. That is, a single crystal can be grown by forming finely these materials to make the above different material.

According to the single crystal growth method as described in detail above, the above semiconductor single crystal region can be formed on the insulator substrate.

What is claimed is:

1. A semiconductor article having a plurality of semiconductor single crystal regions comprising:
    a common insulator substrate having a plurality of concavities, wherein said plurality of concavities have exposed surfaces of an amorphous material;
    a semiconductor single crystal region of one electroconductive type arranged in at least one of said concavities on said common insulator substrate; and
    a semiconductor single crystal region of the opposite electroconductive type arranged in at least a second one of said concavities having an exposed surface of an amorphous material on said common insulator substrate, at least said semiconductor single crystal region of the one electroconductive type being provided by forming a different material which is sufficiently greater in nucleation density than the material of said common insulator substrate and sufficiently fine to the extent that only one single nucleus of the semiconductor material can grow and then permitting the semiconductor material to grow around the single nucleus formed as the center.

2. A semiconductor article according to claim 1, wherein said semiconductor single crystal region of the one electroconductive type and said semiconductor single crystal region of the opposite electroconductive type are provided by forming a different material which is sufficiently greater in nucleation density than the material of said insulator substrate and sufficiently fine to the extent that only one single nucleus of the semiconductor material can grow and permitting the semiconductor material to grow around the single nucleus formed as the center.

3. A semiconductor article according to claim 1, wherein said semiconductor single crystal region of the one electroconductive type is provided in a plural number by forming a different material which is sufficiently greater in nucleation density than the material of said insulator substrate and sufficiently fine to the extent that only one single nucleus of the semiconductor material can grow and permitting the semiconductor material to grow around the single nucleus formed as the center, and said semiconductor single crystal region of the opposite electroconductive type is provided on a part of said semiconductor single crystal regions of one electroconductive type.

* * * * *